(12) United States Patent
Chiba

(10) Patent No.: US 6,651,969 B2
(45) Date of Patent: Nov. 25, 2003

(54) TABLE POSITIONING DEVICE

(75) Inventor: Jiro Chiba, Hotaka-machi (JP)

(73) Assignee: Harmonic Drive Systems, Inc., Tokyo (JP)

( * ) Notice: Subject to any disclaimer, the term of this patent is extended or adjusted under 35 U.S.C. 154(b) by 71 days.

(21) Appl. No.: 09/862,721

(22) Filed: May 23, 2001

(65) Prior Publication Data

US 2002/0003413 A1 Jan. 10, 2002

(51) Int. Cl.[7] ............................................... B25B 1/22
(52) U.S. Cl. ...................... 269/73; 269/60; 269/289 R; 269/71
(58) Field of Search ................... 269/32, 228, 73, 269/71, 198, 60, 289 R, 229; 29/281.1

(56) References Cited

U.S. PATENT DOCUMENTS

| | | | | |
|---|---|---|---|---|
| 4,409,860 A | * | 10/1983 | Moriyama et al. | 269/60 |
| 4,492,356 A | * | 1/1985 | Taniguchi et al. | 269/60 |
| 4,896,869 A | * | 1/1990 | Takekoshi | 269/60 |
| 4,948,330 A | * | 8/1990 | Nomura et al. | 269/60 |
| 5,031,547 A | * | 7/1991 | Hirose | 269/60 |

* cited by examiner

Primary Examiner—Lee D. Wilson
(74) Attorney, Agent, or Firm—Burns, Doane, Swecker & Mathis, L.L.P.

(57) ABSTRACT

A table positioning device has a moving table and three table moving mechanisms for moving the moving table, and three position sensors for detecting positions in different directions of the moving table. Based on the detected date of the position sensors, the table moving mechanisms are controlled to move the moving table to a desired position. The table moving mechanisms have eccentric cams 601–603, and three pairs of parallel plates. The cams are sandwiched between the respective pairs of the parallel plates, respectively. Since the eccentric cam type table moving mechanisms are utilized and the amounts of movement of the table caused by the table moving mechanism are fed back, a small and inexpensive table positioning device can be realized. It is not required to provide a pre-loading mechanism for maintaining the moving table and the cams in a contacted state, whereby simplifying the device structure and reducing the manufacturing cost.

7 Claims, 3 Drawing Sheets

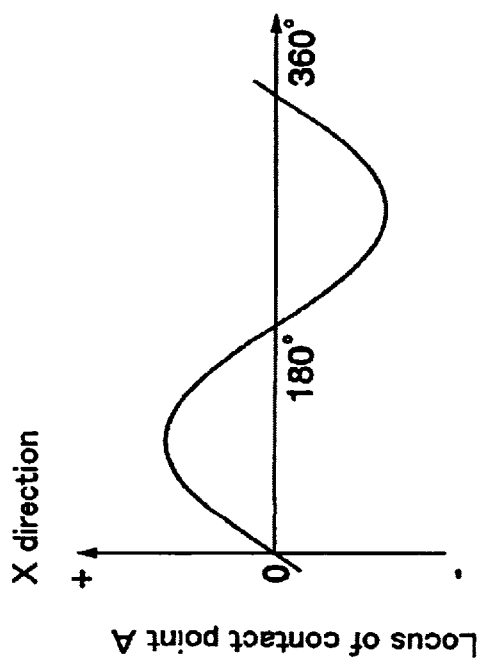
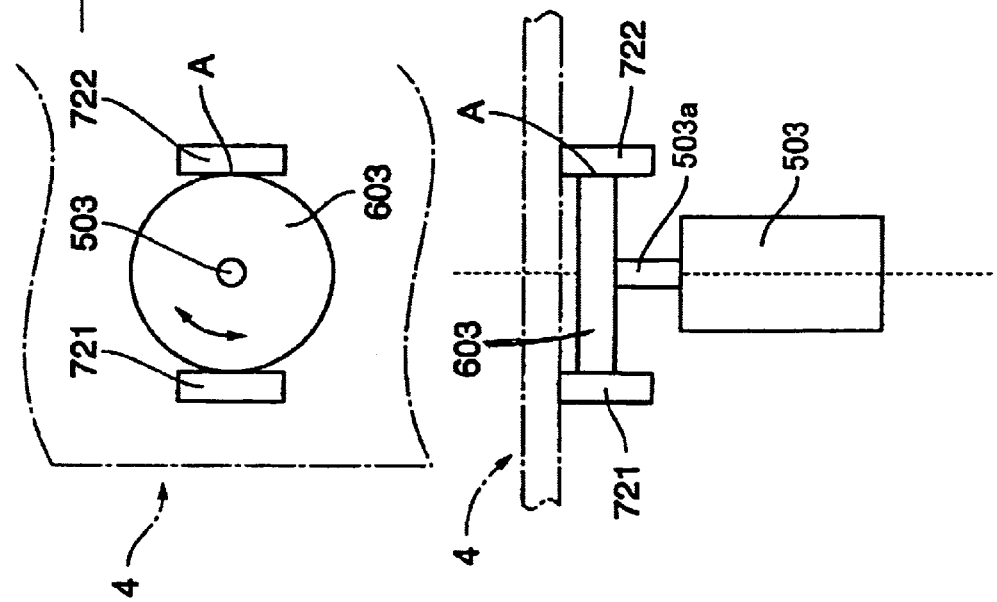
Fig.2C
Fig.2B
Fig.2A

TABLE POSITIONING DEVICE

BACKGROUND OF THE INVENTION

1. Field of the Invention

This invention relates to a table positioning device for positioning a moving table which can be moved two-dimensionally or rotated on a reference plane, at a desired position or rotational angular position with high accuracy.

More specifically, this invention pertains to a table positioning device having a high rigidity table moving mechanism which is constituted to contribute to reduction in size and cost thereof.

2. Related Art Description

Generally, X-Y table mechanism has a fixed table, an X-axis table mounted on the fixed table in a matter that it is allowed to move linearly and reciprocally in the X-axis direction, a Y-axis table mounted on the X-axis table in a manner that it is allowed to move linearly and reciprocally in the Y-axis direction, and a linear drive mechanism for moving these tables so as to position them two-dimensionally at a desired position.

Further, X-Y table mechanism has a clamping mechanism for clamping the tables at a desired position after they are moved to the desired position. When the table are moved to another position, clamping by the clamp mechanism is released to allow the tables to move freely, and the linear drive mechanism is driven to move the tables.

A main object of this invention is to provide a table positioning device which has a table moving mechanism for moving tables on a reference plane, wherein the table moving mechanism is constituted to have a high rigidity, and to reduce in size and cost thereof.

SUMMARY OF THE INVENTION

In order to achieve the above and other objects, according to this invention, there is provided a table positioning device which has a fixed table formed on its surface with a reference plane, a moving table supported on the fixed table in a manner that it is allowed to move two-dimensionally on the reference plane, and a plurality of table moving mechanisms for moving the moving table on the reference plane, characterized in that each of the table moving mechanism comprises a servo motor, an eccentric cam which is rotated by the servo motor, and first and second parallel plates fixed on the moving table in a manner that the eccentric cam is sandwiched between them, whereby eccentric rotational motion of the eccentric cam is converted into linear motion of the moving table.

The table moving mechanisms may include first, second and third table moving mechanisms of the same structure. In this case, it is preferable for the table positioning device to have first, second and third sensors for detecting respective amounts of movement of the moving table caused by the respective first to third table moving mechanisms.

Further, it is also preferable that the first and second table moving mechanisms are designed to move the moving table in a first direction at different positions, and the third table moving mechanism is to move the moving table in a second direction perpendicular to the first direction. With this configuration, the amount of eccentric rotation of the eccentric cam in each of the table moving mechanisms is controlled, so that linear movement and rotation of the moving table can be realized.

On the other hand, according to this invention, there is provided a table positioning device which has a fixed table formed on its surface with a reference plane, a moving table supported on the fixed table in a manner that it is allowed to move two-dimensionally on the reference plane, and a plurality of table moving mechanisms for moving the moving table on the reference plane, characterized in that:

the table positioning device has a table position detecting means for detecting a position of the moving table, a clamp mechanism for clamping the moving table, and a control means for controlling the table moving mechanisms and the clamp mechanism to position the moving table at a desired position based on a detected position of the moving table by the table position detecting means, wherein the table moving mechanisms include at least first, second and third table moving mechanisms, each of which has a linear moving mechanism for moving the moving table linearly, and wherein the linear moving mechanism has a servo motor which is controlled and driven by the control means, an eccentric cam which is rotated by the servo motor, and first and second parallel plates fixed on the moving table in a manner that the eccentric cam is sandwiched between them, whereby eccentric rotational motion of the eccentric cam is converted into linear motion of the moving table.

The table position detecting means preferably includes first, second and third position sensors for detecting movement amounts of the moving table caused by the respective eccentric cams.

Further, it is also preferable that the first and second table moving mechanisms are designed to move the moving table in a first direction at different positions, and the third table moving mechanism is to move the moving table in a second direction perpendicular to the first direction. With this configuration, the amount of eccentric rotation of the eccentric cam in each of the table moving mechanisms is controlled, so that linear movement and rotation of the moving table can be realized.

BRIEF DESCRIPTION OF THE DRAWINGS

FIGS. 2A and 2B are a side plan view and a plan view of a table moving mechanism of the device of FIG. 1, and FIG. 2C is a graph showing a stroke of a table contact point of an eccentric cam with respect to rotational angle of the eccentric cam.

DETAILED DESCRIPTION OF PREFERRED EMBODIMENT

With reference to the attached drawings, an example of a table positioning device according to this invention will be described.

Overall Structure

Figure 1:
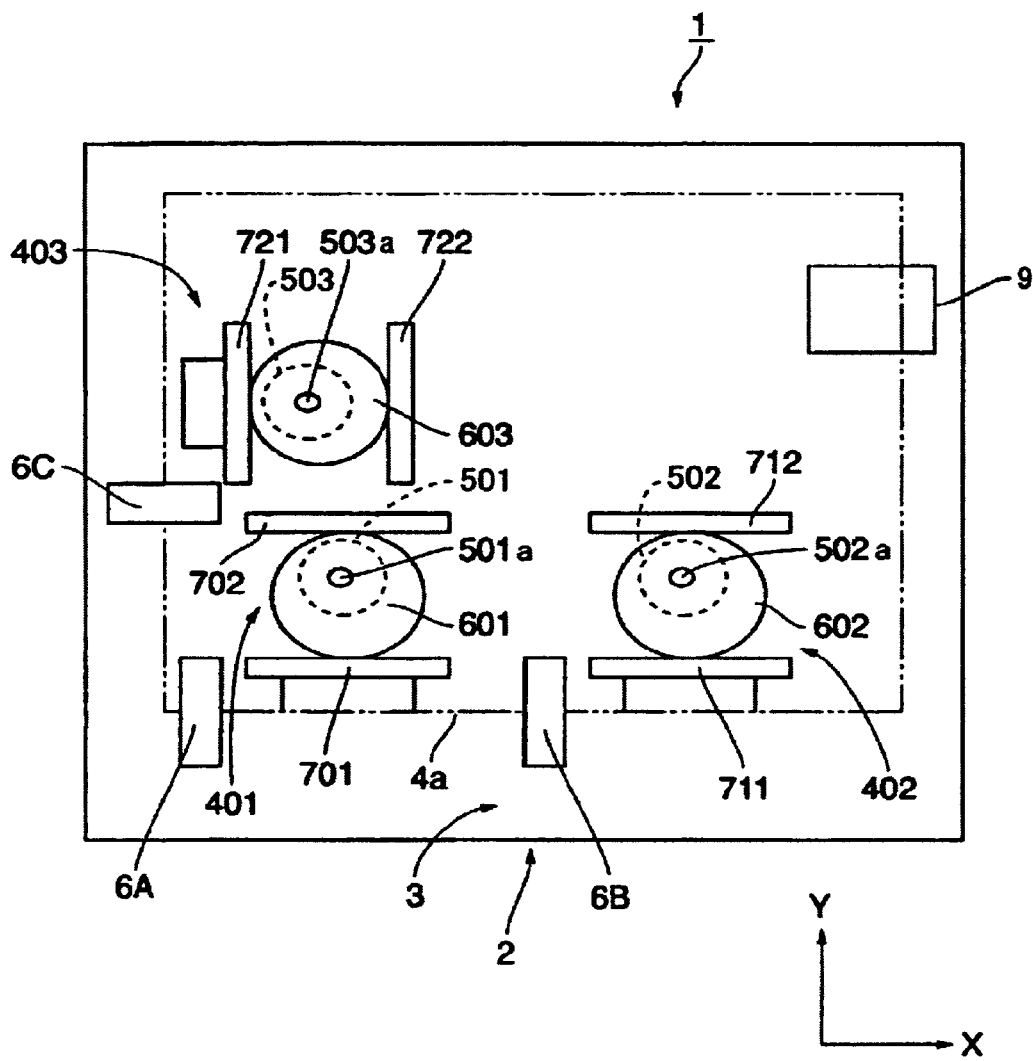
FIG. 1 is a schematic view of a table positioning device according to this invention.

FIG. 1 is a schematic diagram of a table positioning device of this example. As shown in this figure, the table positioning device 1 has a fixed table 2 formed on its surface with a reference plane 3, and a moving table 4 mounted on the reference plane 3 in a condition that it is allowed to move along the reference plane 3. It also has first and second table moving mechanisms 401 and 402 for moving the moving table 4 linearly along Y-axis direction on the reference plane 3, and a third table moving mechanism 403 for moving the moving table 4 linearly along X-axis direction on the reference plane 3.

Further, the table positioning device 1 has first, second and third position sensors 6A, 6B and 6C for detecting the respective amounts of table movement caused by the respective table moving mechanisms 401, 402 and 403, and a clamp mechanism 9 for clamping the moving table to fix it on the fixed table 2.

The table moving mechanisms 401, 402 and 403 of this example have servo motors 501, 502 and 503, disc shaped eccentric cams 601, 602 and 603 fixed eccentrically on output shafts 501a, 502a and 503a of the servo motors, and three pairs of parallel plates (701, 702), (712, 712) and (721, 722) fixed on the moving table 4 in a manner that the eccentric cams 601, 602 and 603 are sandwiched between the corresponding pairs of parallel plates.

More specifically, the eccentric cams 601 is sandwiched between the parallel plates 701 and 702 along Y direction, and the eccentric cams 602 is also sandwiched between the parallel plates 711 and 712 along Y direction. Thus, the eccentric cam 601 or 602 is rotated eccentrically to move the moving table 4 along Y direction. Whereas, the eccentric cam 603 is sandwiched between the parallel plates 721 and 722 along X direction, and rotation thereof causes to move the moving table 4 along X direction. Further, rotational amounts of these eccentric cams 601, 602 and 603 are controlled separately, so that the moving table 4 is moved to a desired position on the reference plane and that it is rotated about an axis perpendicular to the reference plane.

FIGS. 2A and 2B illustrate an operation of the eccentric cam 603 to move the moving table 4. As shown in this figure, the third table moving mechanism 403 has the servo motor 503, the eccentric cam 603 fixed on the output shaft 503a of the motor 503, and a pair of parallel plates 721 and 722 between which the eccentric cam 603 is sandwiched from both sides along X direction. The servo motor 513 is driven to rotate the eccentric cam 603 eccentrically, whereby a pair of contact points between the eccentric cam 603 and the parallel plates 721, 722 are shifted reciprocally along X direction. For example, the contact point A between the cam 603 and the plate 722 is shifted reciprocally along X direction as the eccentric cam is rotated. FIG. 2C illustrates a locus of the contact point A with respect to the rotational angle of the eccentric cam 603. The locus of the contact point A is defied by a sine curve. The other two table moving mechanisms 401 and 402 have the same configuration as that of the table moving mechanism 403.

Figure 3:
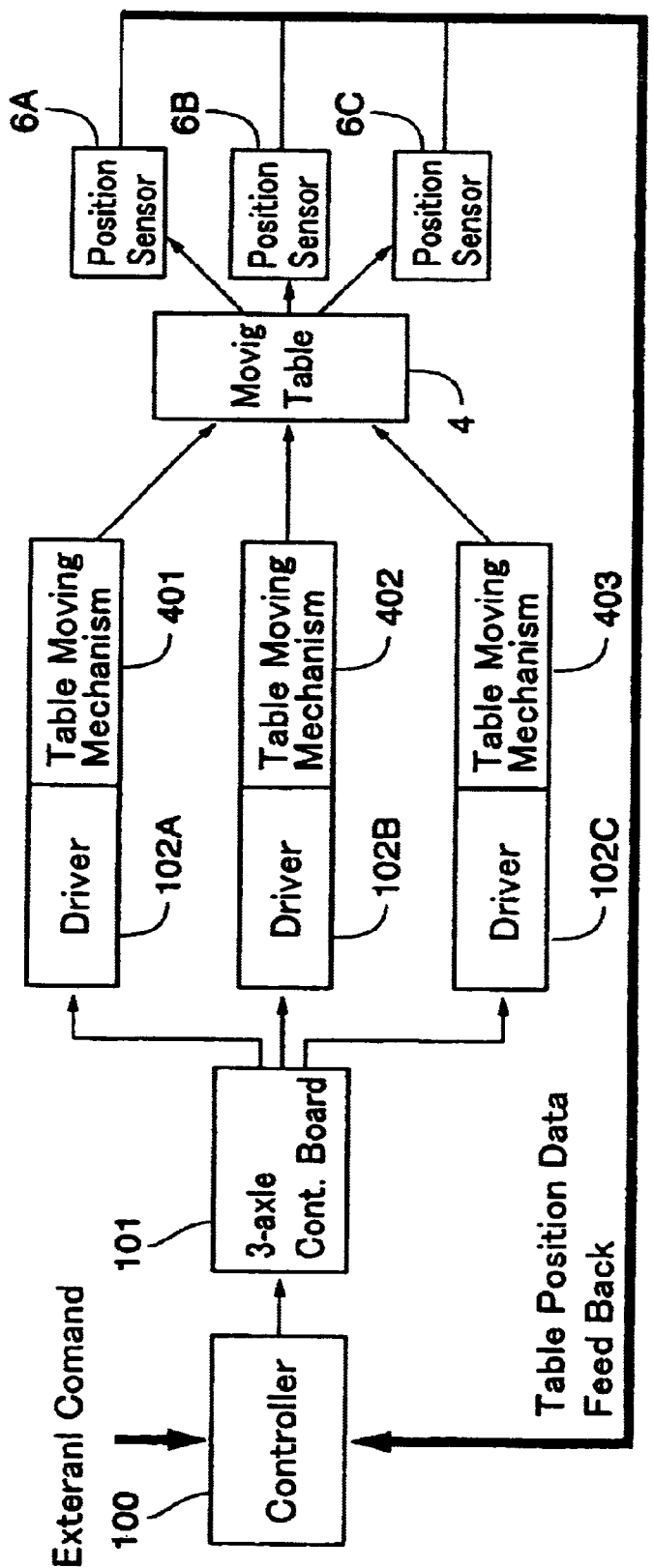
FIG. 3 is a schematic block diagram of a control system of the device of FIG. 1.

Next, FIG. 3 is a schematic block diagram of a control system of the table positioning device 1. As shown in this figure, the control system has a controller 100 as its main portion which is constituted mainly by a microcomputer. The respective table moving mechanisms 401, 402 and 403 are controlled via three axle control board 101 and respective drivers 102A, 102B and 102C by the controller 100. The controller 100 carries out control programs stored in its ROM to position the moving table 4 at a desired position designated by an external command input in accordance with position data from the respective position sensors 6A, 6B and 6C.

Controlling operation conducted by the control system 100 is as follows. Upon receiving an external command indicating a desired position of the moving table 4, the moving table 4 is unclamped and becomes movable condition on the reference plane 3.

Thereafter, the three table moving mechanisms 401 to 403 are driven to move the moving table toward the desired position. When the three position sensors 6A to 6C detect that the moving table 4 reaches the desired position, the respective table moving mechanisms 401 to 403 are stopped and the moving table 4 is clamped at the desired position.

The thus constituted table positioning device of this example uses three eccentric cam type table moving mechanisms to move and rotate the moving table on the reference plane. Further, the amounts of movement of the moving table 4 caused by the respective table moving mechanisms are fed back by means of the position sensors 6A to 6C.

Accordingly, the table positioning device 1 can be made small in size and cheaply and yet has a capability of positioning the moving table accurately, in comparison with the conventional stage mechanisms wherein an X stage and a Y stage are piled on or those wherein stages are linearly moved by means of a linear drive mechanism having a push rod and the like.

Further, according to the table moving mechanism of this example, a pre-loading mechanism is not required for constantly pressing the moving table against the eccentric cams. Therefore, the mechanism can be simplified in structure and reduced in manufacturing cost, and yet can easily be manufactured.

In addition, since the eccentric cams have a circular shape, the gap between the two parallel plates is set to be a diameter of the cam, which makes it easy to adjust the gap.

As mentioned above, according to the table positioning device of this invention, the eccentric cam type table moving mechanisms are utilized, and the amounts of movement of the moving table caused by the table moving mechanisms are fed back, so that a small and inexpensive table positioning device can be realized.

Further, according to this invention, it is not required to provide a pre-loading mechanism for maintaining the moving table and the cams in a contacted state, whereby simplifying the device structure and reducing the manufacturing cost.

What is claimed is:

1. A table positioning device comprising a fixed table formed on its surface with a reference plane, a moving table supported on the fixed table in a manner that it is allowed to move two-dimensionally on the reference plane, and a plurality of table moving mechanisms for moving the moving table on the reference plane,
    wherein each of the table moving mechanisms comprises a servo motor, an eccentric cam which is rotated by the servo motor, and first and second parallel plates fixed on the moving table in a manner that the eccentric cam is sandwiched between them, whereby eccentric rotational motion of the eccentric cam is converted into linear motion of the moving table.

2. The table positioning device according to claim 1, wherein the table moving mechanisms include first, second and third table moving mechanisms of the same structure.

3. The table positioning device according to claim 2, further comprising first, second and third sensors for detecting respective amounts of movement of the moving table caused by the respective first to third table moving mechanisms.

4. The table positioning device according to claim 3, wherein the first and second table moving mechanisms are designed to move the moving table in a first direction at different positions, and the third table moving mechanism is to move the moving table in a second direction perpendicular to the first direction, and wherein by controlling the amount of eccentric rotation of the eccentric cam in each of the table moving mechanisms, linear movement and rotation of the moving table are carried out.

5. A table positioning device comprising a fixed table formed on its surface with a reference plane, a moving table supported on the fixed table in a manner that it is allowed to move two-dimensionally on the reference plane, and a plurality of table moving mechanisms for moving the moving table on the reference plane, wherein:

the table positioning device has a table position detecting means for detecting a position of the moving table, a clamp mechanism for clamping the moving table, and a control means for controlling the table moving mechanisms and the clamp mechanism to position the moving table at a desired position based on a detected position of the moving table by the table position detecting means, the table moving mechanisms include at least first, second and third table moving mechanisms, each of which has a linear moving mechanism for moving the moving table linearly, and each of the linear moving mechanisms has a servo motor which is controlled and driven by the control means, an eccentric cam which is rotated by the servo motor, and first and second parallel plates fixed on the moving table in a manner that the eccentric cam is sandwiched between them, whereby eccentric rotational motion of the eccentric cam is converted into linear motion of the moving table.

6. The table positioning device according to claim 5, wherein the table position detecting means includes first, second and third position sensors for detecting movement amounts of the moving table caused by the respective eccentric cams.

7. The table positioning device according to claim 6, wherein the first and second table moving mechanisms are designed to move the moving table in a first direction at different positions, and the third table moving mechanism is to move the moving table in a second direction perpendicular to the first direction, and wherein by controlling an amount of eccentric rotation of the eccentric cam in each of the table moving mechanisms, linear movement and rotation of the moving table are carried out.

* * * * *